(12) United States Patent  (10) Patent No.: US 8,405,012 B1
Herman et al.  (45) Date of Patent: Mar. 26, 2013

(54) OUT-OF-PLANE DEFLECTION MEMS ACTUATOR FOR PROJECTILE CONTROL SURFACES

(75) Inventors: David Herman, Charlotte, NC (US); Michael Deeds, Port Tabacco, MD (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 746 days.

(21) Appl. No.: 11/729,089

(22) Filed: Mar. 26, 2007

(51) Int. Cl.
*F42B 15/01* (2006.01)
*H01L 29/84* (2006.01)
*G01L 9/00* (2006.01)

(52) U.S. Cl. .................. 244/3.27; 257/415; 257/419

(58) Field of Classification Search ............ 244/3.21, 244/3.27, 200.1, 203, 215; 385/23, 74; 257/415, 257/419
See application file for complete search history.

(56) References Cited

U.S. PATENT DOCUMENTS

| | | | |
|---|---|---|---|
| 5,824,910 A | 10/1998 | Last et al. | |
| 6,069,392 A | 5/2000 | Tai et al. | |
| 6,105,904 A | 8/2000 | Lisy et al. | |
| 6,175,170 B1 | 1/2001 | Kota et al. | |
| 6,210,046 B1 | 4/2001 | Rogers et al. | |
| 6,474,593 B1 | 11/2002 | Lipeles et al. | |
| 6,685,143 B1 | 2/2004 | Prince et al. | |
| 6,804,036 B1 | 10/2004 | Chen et al. | |
| 6,853,765 B1 | 2/2005 | Cochran | |
| 7,692,127 B1 * | 4/2010 | Linn et al. | 244/3.21 |
| 2003/0218102 A1 | 11/2003 | Van Dam et al. | |

OTHER PUBLICATIONS

U.S. Appl. No. 11/729,088, filed Mar. 26, 2007, Herman et al.
U.S. Appl. No. 11/729,086, filed Mar. 26, 2007, Linn, et al.

* cited by examiner

*Primary Examiner* — Rob Swiatek
*Assistant Examiner* — Valentina Xavier
(74) *Attorney, Agent, or Firm* — Fredric J. Zimmerman

(57) ABSTRACT

A MEMS type actuator includes a substrate defining a plane; a micro bellows disposed on the substrate and operable to expand in a direction out of a substrate plane, the substrate having an opening therein for fluid flow to the micro bellows; and a ramp disposed above the micro bellows. In a collapsed position of the micro bellows, the ramp is substantially parallel to the plane of the substrate and, in expanded positions of the micro bellows, the micro bellows applies a force to the ramp thereby causing rotation of the ramp in a direction out of the substrate plane.

18 Claims, 6 Drawing Sheets

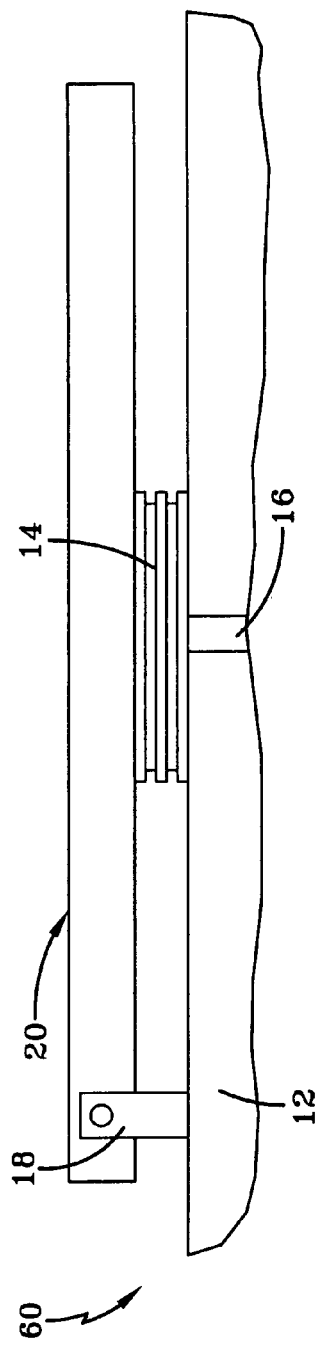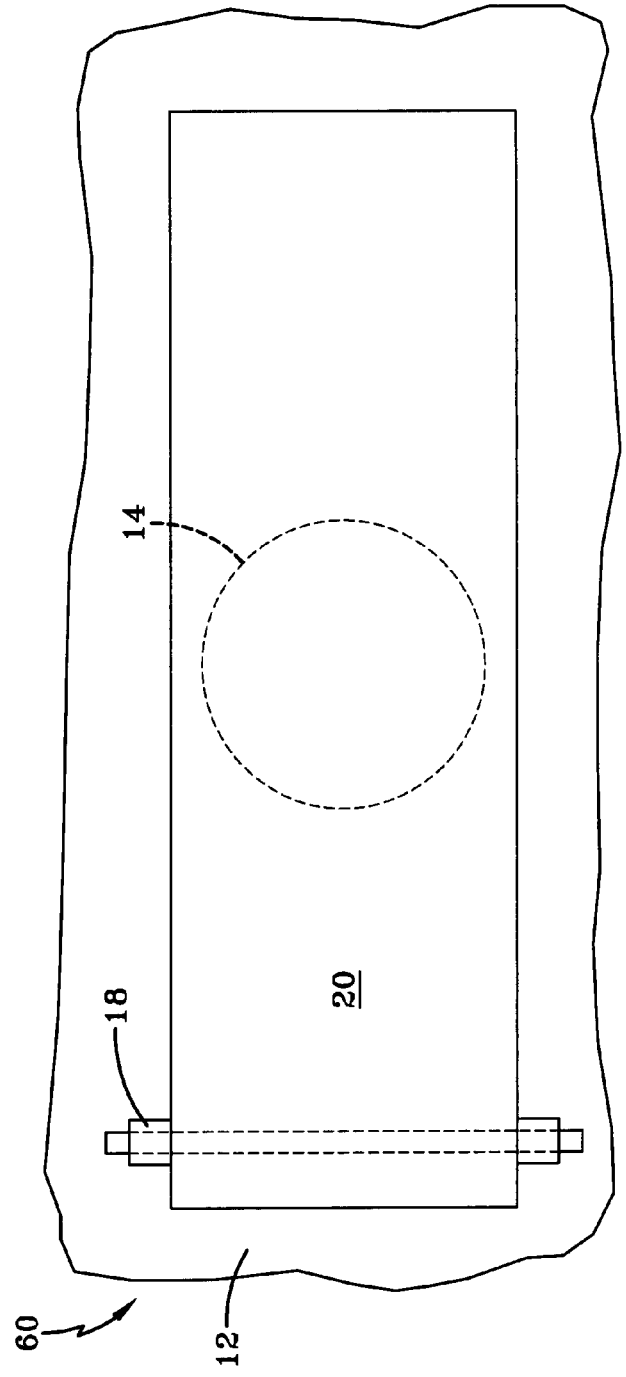
FIG-10A
FIG-10B

OUT-OF-PLANE DEFLECTION MEMS ACTUATOR FOR PROJECTILE CONTROL SURFACES

STATEMENT OF GOVERNMENT INTEREST

The invention described herein may be manufactured and used by or for the Government of the United States of America for government purposes without the payment of any royalties thereof.

BACKGROUND OF THE INVENTION

The invention relates in general to microelectromechanical (MEMS) devices and in particular to MEMS devices that provide deflection out of the plane of the MEMS substrate.

Conventional systems for guiding missiles or projectiles in flight use canards, or small wing-like structures, to steer the projectile. These structures are large (approximately 3" in length) and require motors to actuate. The stabilizing fins on the projectile have to be increased in size to counteract the effect the canards have of moving the center of pressure forward.

A MEMS control surface can reduce drag and hence increase the range of projectiles by eliminating the drag associated with canards and reducing the drag of the fins. In addition, MEMS control surfaces may reduce volume, weight, and power requirements, further increasing the projectile's range. Another added benefit of the MEMS control surface is the reduction of cost associated with batch fabrication techniques.

Known MEMS devices for producing a mechanical deflection include various types of thermally actuated beams, including cantilever and arch beams. These beams have proven successful in producing a deflection in the plane of the MEMS substrate. Devices such as projectile control surfaces, however, require a deflection out of the plane of the MEMS substrate, that is, in a direction perpendicular to the MEMS substrate.

One MEMS type apparatus that provides out-of-plane deflection is shown in U.S. Pat. No. 5,824,910 issued on Oct. 20, 1998 and entitled "Miniature Hydrostat Fabricated Using Multiple Microelectromechanical Processes." Another MEMS type apparatus that provides out-of-plane deflection is shown in U.S. Pat. No. 6,069,392 issued on May 30, 2000 and entitled "Microbellows Actuator." These two U.S. patents are expressly incorporated by reference. A third MEMS type apparatus that provides out-of-plane deflection is shown in U.S. Pat. No. 6,474,593 issued on Nov. 5, 2002 and entitled "Guided Bullet."

The vertical deflection of a single diaphragm actuator, like the hydrostat mentioned above, is limited by the diameter of the diaphragm and its thickness. A micro bellows actuator is able to deliver much greater vertical deflections for a similar sized device. However, the deflections required to make an effective control surface are many times greater than a micro bellows alone can provide. The electrostatically actuated curved beam shown in U.S. Pat. No. 6,474,593 cannot withstand high-speed flow forces. A suitable control surface can be realized by combining a micro bellows actuator with a ramp capable of being rotated out of plane.

SUMMARY OF THE INVENTION

It is an object of the invention to provide a MEMS device that can provide vertical deflection, out of the plane of the MEMS substrate.

It is another object of the invention to provide a MEMS device that can provide vertical deflections larger than known MEMS devices.

Yet another object of the invention is to provide a MEMS device that is operable as a control surface for high-speed projectiles.

One aspect of the invention is a MEMS apparatus includes a substrate defining a plane; a micro bellows disposed on the substrate and operable to expand in a direction out of the substrate plane, the substrate having an opening therein for fluid flow to the micro bellows; and a rotatable ramp disposed above the micro bellows; where, in a collapsed position of the micro bellows, the ramp is substantially parallel to the plane of the substrate and where, in expanded positions of the micro bellows, the micro bellows applies a force to the ramp causing rotation of the ramp in the direction out of the substrate plane.

In an embodiment, the MEMS apparatus further includes a ramp support disposed on the substrate, the ramp being rotatably connected to the ramp support. The ramp may comprise a pair of legs and a body, the pair of legs being connected to the ramp support and defining an open area therebetween wherein the micro bellows is disposed.

In another embodiment, the ramp support includes a pair of spring supports disposed on the substrate and a pair of torsional springs, the torsional springs being attached at first ends to the ramp and at second ends to the spring supports, respectively.

In yet another embodiment, the ramp support includes a hinge support disposed on the substrate and a hinge attached to the hinge support and the ramp.

In an alternative embodiment, the micro bellows includes a plurality of bleed openings in a top surface thereof.

Another aspect of the invention is a projectile including a flow surface; at least one MEMS apparatus disposed at the flow surface such that, in a collapsed position of the micro bellows, the MEMS apparatus is substantially flush with the flow surface and in an expanded position of the micro bellows, the ramp of the MEMS apparatus extends out of a plane of the flow surface.

In an embodiment, the projectile includes a plurality of the MEMS apparatus disposed at the flow surface. The projectile may further comprise a source of fluid pressure and a fluid connection between the source of fluid pressure and the opening in the substrate of the MEMS apparatus.

BRIEF DESCRIPTION OF THE DRAWINGS

In the drawings, which are not necessarily to scale, like or corresponding parts are denoted by like or corresponding reference numerals.

FIG. 10A is a schematic side view of another embodiment of a MEMS device in a collapsed position.

FIG. 10B is a top view of FIG. 10A.

DETAILED DESCRIPTION OF EXEMPLARY EMBODIMENTS OF THE INVENTION

Figure 1:
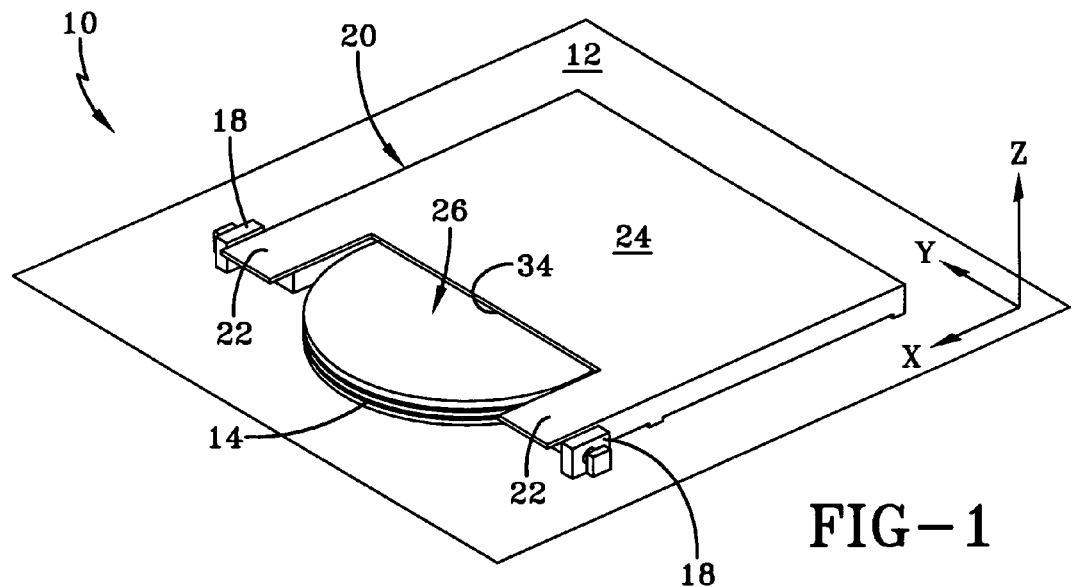
FIG. 1 is a schematic perspective view of a MEMS device in a collapsed position.
Figure 2:
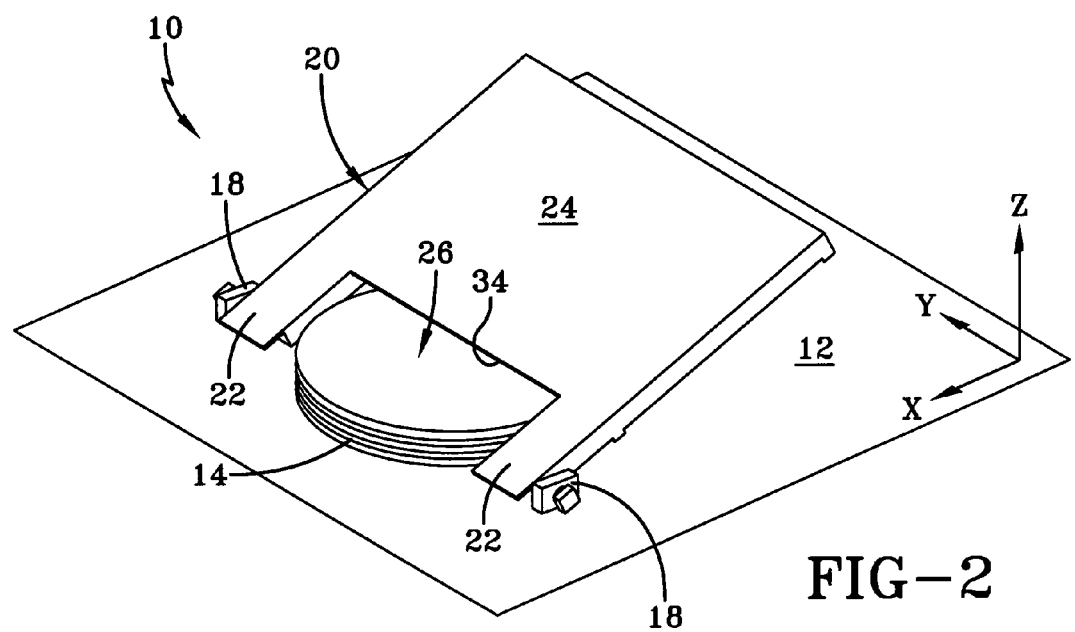
FIG. 2 is a schematic perspective view of the MEMS device of FIG. 1 in an expanded position.

FIG. 1 is a schematic perspective view of one embodiment of a MEMS device 10 in a collapsed position. FIG. 2 is a schematic perspective view of the MEMS device 10 of FIG. 1 in an expanded position. MEMS device 10 includes a substrate 12 that defines, for example, an XY plane. A micro bellows 14 is disposed on the substrate 12. Micro bellows 14 is operable to expand in a direction Z that is out of the substrate plane XY. A pair of ramp supports 18 are disposed on the substrate 12 on opposite sides of the micro bellows 14. A ramp 20 is rotatably connected to the pair of ramp supports 18.

Figure 3:
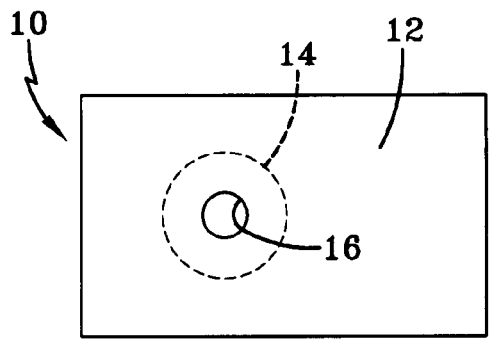
FIG. 3 is a schematic bottom view of the device of FIG. 1.

The ramp 20 includes a pair of legs 22 and a body 24. The pair of legs 22 are connected to the pair of ramp supports 18 with, for example, pins. The pair of legs 22 define an open area 26 therebetween where the micro bellows 14 is disposed. FIG. 3 is a bottom view of the device 10 showing an opening 16 in the substrate 12 for fluid flow to the micro bellows 14.

In the collapsed position (FIG. 1) of the micro bellows 14, the ramp 20 is substantially parallel to the plane of the substrate 12. In expanded positions (FIG. 2) of the micro bellows 14, the micro bellows 14 applies a force to the ramp 20 along a contact line 34 thereby causing rotation of the ramp 20 in the Z direction out of the substrate plane 12.

Figure 4:
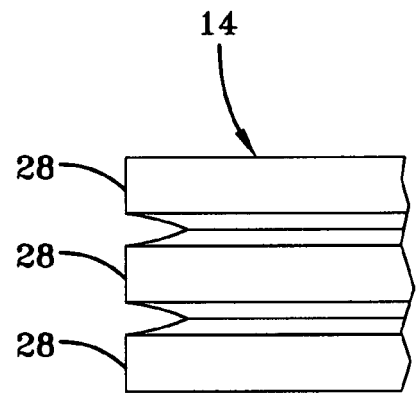
FIG. 4 is a partial side view of a micro bellows.

FIG. 4 is a partial side view of micro bellows 14 showing three folds 28. Of course, micro bellows 14 may include less than three folds or more than three folds. For a three-fold micro bellows, the deflection in the Z-direction from the collapsed position to a fully expanded position is on the order of about 200 microns. Micro bellows 14 may have a diameter, for example, on the order of about 400 microns to about 800 microns. A distance between the ramp supports 18, which corresponds to an exemplary width of the ramp 20, may be, for example, on the order of a millimeter. In the fully expanded position of the micro bellows 14, the ramp 20 may form an angle of about 45 degrees with the substrate 12. The deflection of ramp 20 in the Z direction depends on the location of contact line 34 between ramp 20 and micro bellows 14 and the location of the ramp supports 18 (the fulcrum). In the embodiment shown in FIGS. 1-4, the Z direction deflection of ramp 20 is in the range of about one millimeter.

Figure 5:
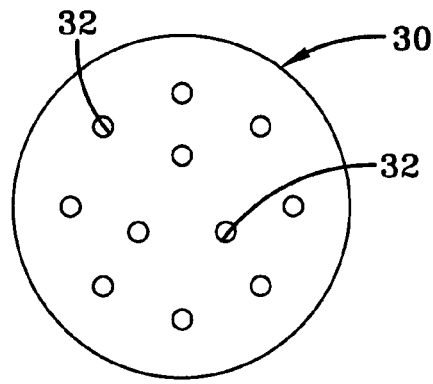
FIG. 5 is a top view of another embodiment of a micro bellows.

MEMS device 10 may have a broad range of applications. In some applications, such as safety and arming devices for munition fuzes, it is often desired that a fluid flow be sustained for the munition to stay armed. In those cases, the micro bellows 30 (shown in top view in FIG. 5) may be substituted for micro bellows 14. Micro bellows 30 is similar to micro bellows 14, except that its top surface includes a plurality of bleed holes 32. Bleed holes 32 allow fluid inside micro bellows 30 to escape. Thus, micro bellows 30 will only maintain its expanded positions and ramp 20 will only be extended in the Z direction if the fluid flow to the micro bellows 30 is sustained. If the fluid flow ceases, the fluid in micro bellows 30 will escape thru bleed holes 32, micro bellows 30 will contract, and ramp 20 will rotate downward to the substrate 12.

As an example, micro bellows 30 may be used in a fuze for a projectile designed for in-flight detonation. As long as the projectile is in-flight, the air pressure around the projectile can be used to maintain the micro bellows 30 in an expanded position and the ramp 20 extended in the Z direction to arm a fuze and allow detonation. If the projectile falls to the ground before detonation, the micro bellows 30 will contract from loss of air pressure and the ramp 20 will rotate downward, disarming the fuze.

Figure 6:
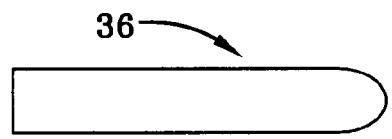
FIG. 6 shows a projectile.
Figure 7:
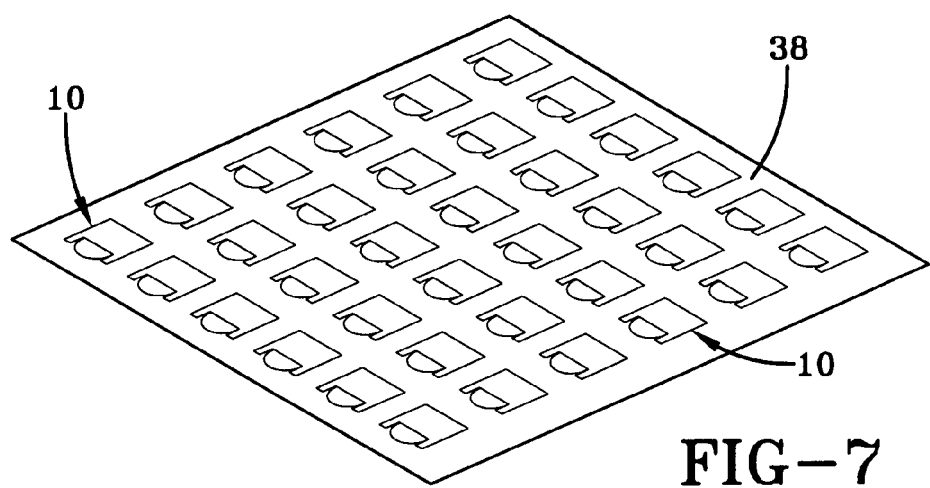
FIG. 7 shows a portion of a flow surface of a projectile.

The MEMS device 10 may also be used to steer projectiles. FIG. 6 shows a projectile 36. As used herein, a projectile 36 may be a missile, rocket or any type of projectile, with or without fins, that is launched in air or water. FIG. 7 shows a portion of a flow surface 38 of a projectile 36. The flow surface 38 may be the external surface of the projectile 36 or it may be the surface of a fin, wing, rudder, etc. A plurality of MEMS devices 10 are disposed in an array on the flow surface 38. The MEMS devices 10 may be arrayed in any manner and number required to steer the projectile 36. When the ramps 20 of the devices 10 are extended upward into the flow stream around surface 38, the ramps will influence the flow stream and alter the path of the projectile 36.

Figure 8:
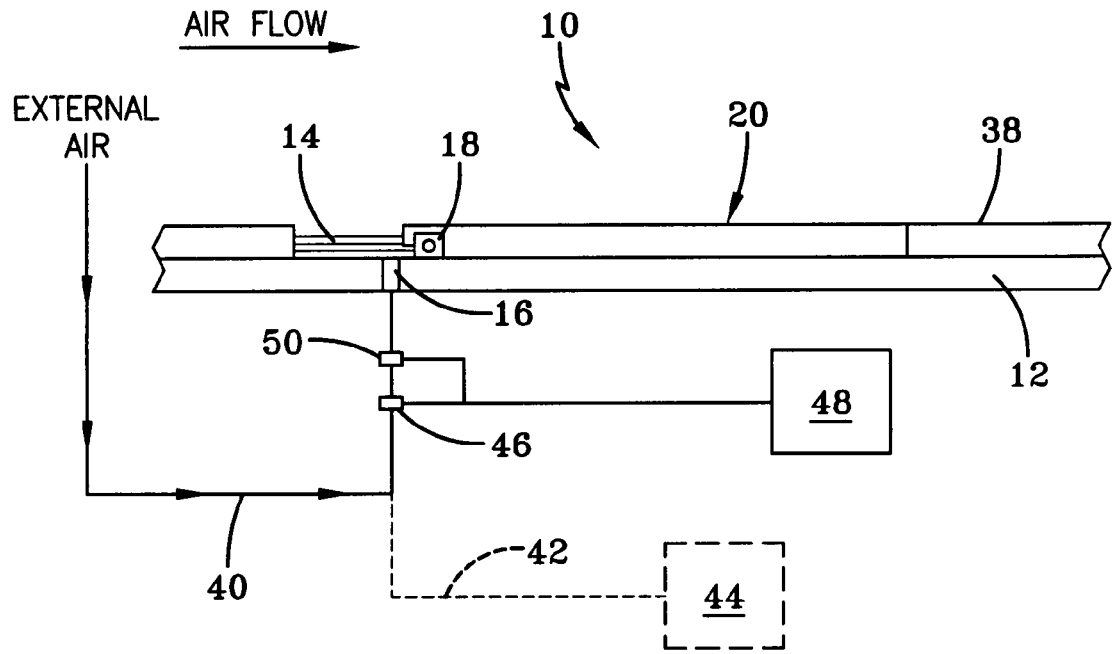
FIG. 8 is a schematic side view of the MEMS device incorporated in a flow surface.
Figure 9:
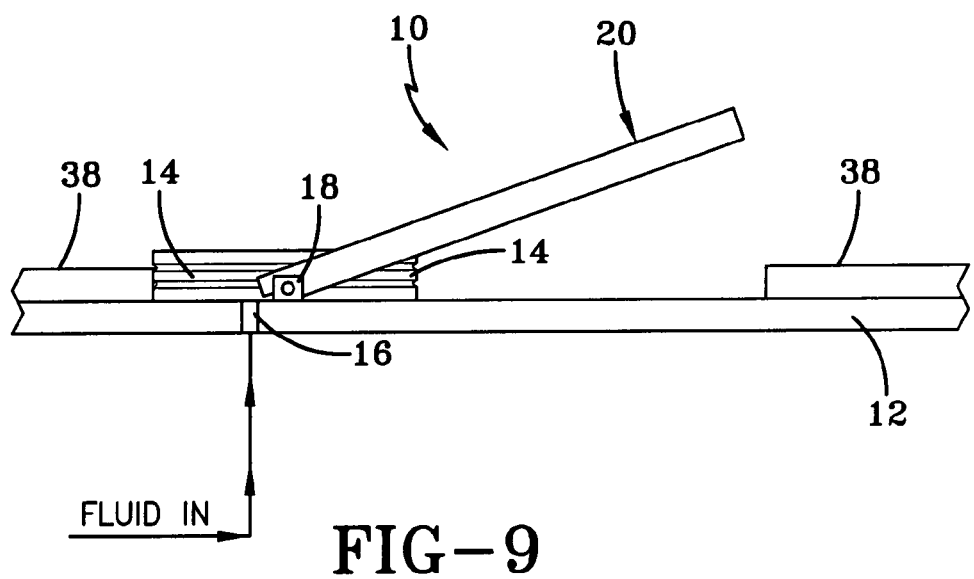
FIG. 9 shows the MEMS device of FIG. 8 in an expanded position.

FIG. 8 is a schematic side view of the MEMS device 10 incorporated in a flow surface 38 and in a collapsed position. FIG. 9 shows the MEMS device 10 of FIG. 8 in an expanded position. The MEMS device 10 is disposed at the flow surface 38 such that, in the collapsed position of the micro bellows 14 (FIG. 8), the MEMS device 10 is substantially flush with the flow surface 38. In an expanded position of the micro bellows 14 (FIG. 9), the ramp 20 of the MEMS device 10 extends out of the plane of the flow surface 38.

A source of fluid pressure is connected via a fluid connection 40 to the opening 16 in the substrate 12. The source of fluid pressure may be, for example, the external air surrounding the flow surface 38 or combustion products (where the projectile is a rocket) from an onboard combustion chamber 44 connected to the opening 16 via connection 42. Fluid flow to the micro bellows 14 is controlled by, for example, a control valve 46 disposed in the fluid connection 40 and connected to an onboard guidance and control system 48. A relief valve 50 may be disposed in the fluid connection 40 to relieve pressure in micro bellows 14 thereby allowing ramp 20 to rotate down to a flush position.

FIG. 10A is a schematic side view of another embodiment of a MEMS device 60 in a collapsed position. FIG. 10B is a top view of FIG. 10A. The MEMS device 60 is similar to MEMS device 10, except there is no cut out portion in the ramp 20. The micro bellows in the MEMS device 60 may be micro bellows 14 without bleed holes, or may be micro bellows 30 which includes bleed holes 32, described earlier. MEMS device 60 functions in the same manner as MEMS device 10 and may be used in the same applications.

Figure 11A:
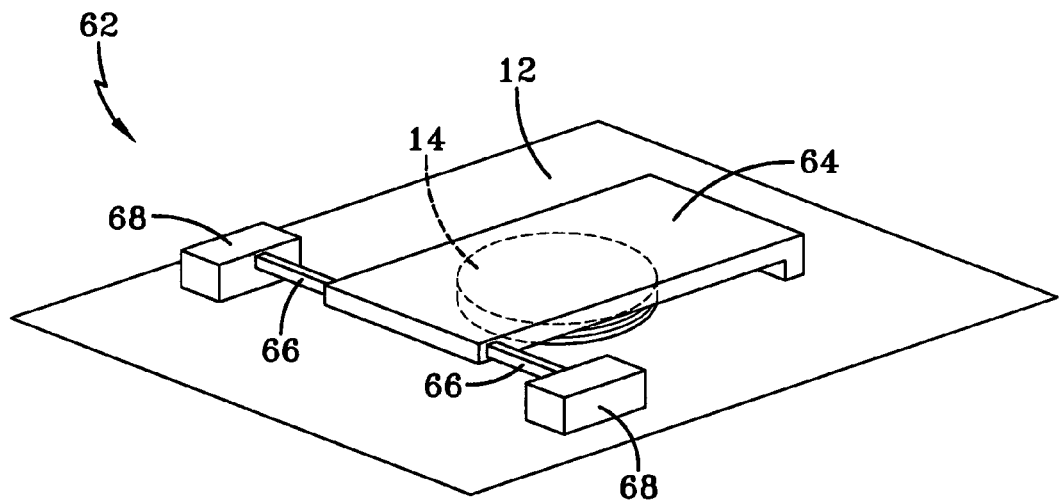
FIG. 11A is a schematic perspective view of another embodiment of a MEMS device in a collapsed position.
Figure 11B:
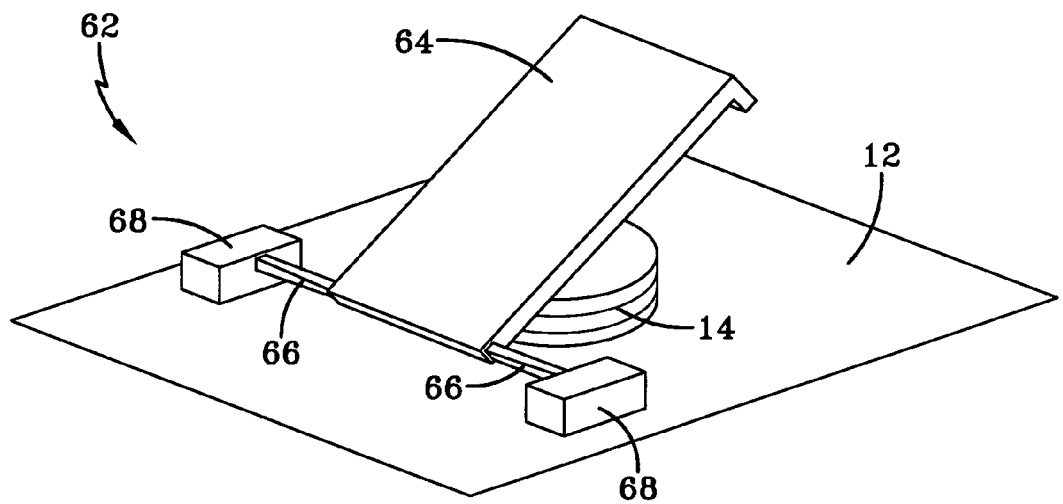
FIG. 11B shows the device of FIG. 11A in an expanded position.

FIG. 11A is a schematic perspective view of another embodiment of a MEMS device 62 in a collapsed position. FIG. 11B shows the device 62 of FIG. 11A in an expanded position. Device 62 includes substrate 12 and micro bellows 14 or micro bellows 30. Ramp 64 is disposed above micro bellows 14 and rotatably supported there by torsional springs 66 attached to spring supports 68 disposed on substrate 12. MEMS device 62 functions similarly to MEMS device 10 and may be used in the same applications.

Figure 12A:
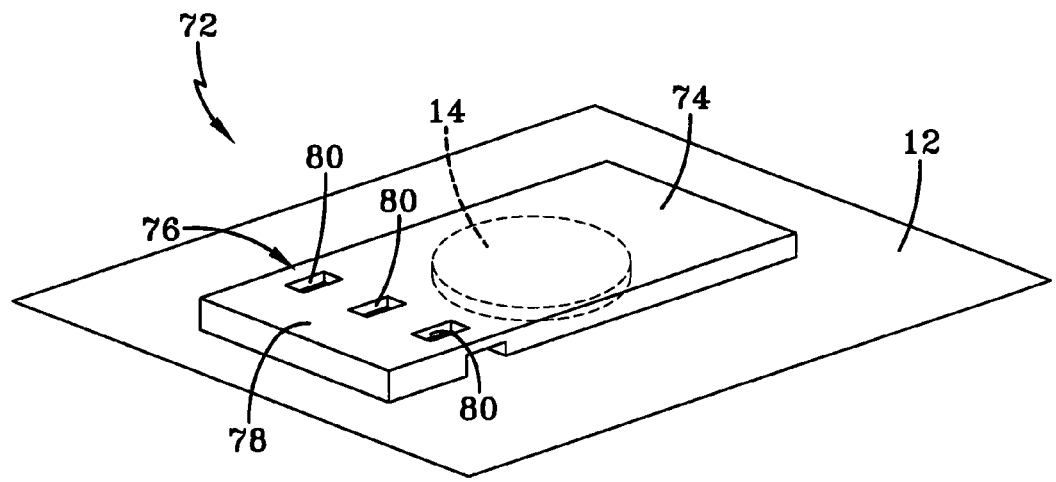
FIG. 12A is a schematic perspective view of another embodiment of a MEMS device in a collapsed position.
Figure 12B:
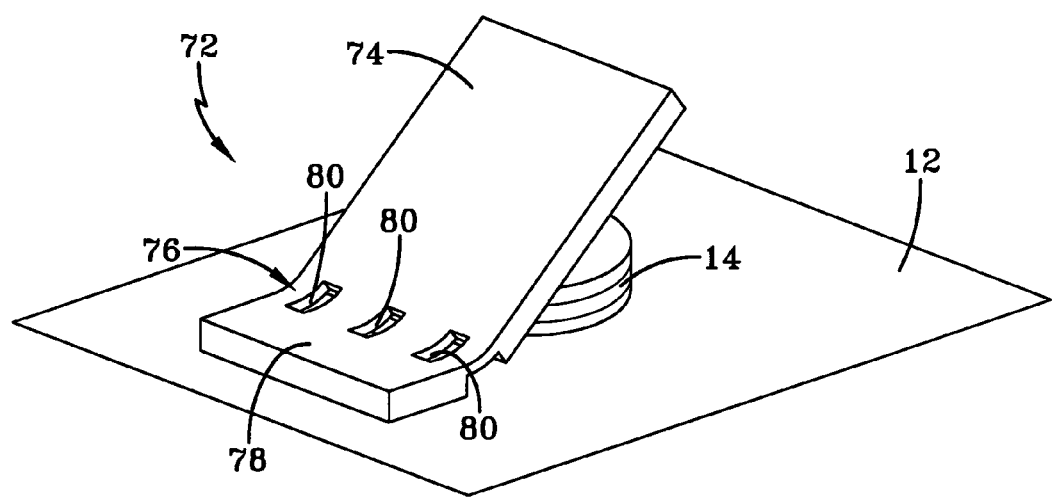
FIG. 12B shows the device of FIG. 12A in an expanded position.

FIG. 12A is a schematic perspective view of another embodiment of a MEMS device 72 in a collapsed position. FIG. 12B shows the device 72 of FIG. 12A in an expanded position. Device 72 includes substrate 12 and micro bellows 14 or micro bellows 30. Ramp 74 is disposed above micro bellows 14 and rotatably supported there by hinge 76 attached to hinge supports 78 disposed on substrate 12. Hinge 76 may take a variety of forms. By way of example and not limitation, hinge 76 may be a reduced thickness area of ramp 74. One or more openings 80 may be formed in the hinge 76 to obtain the required flexibility. MEMS device 72 functions similarly to MEMS device 10 and may be used in the same applications.

While the invention has been described with reference to certain exemplary embodiments, numerous changes, alterations and modifications to the described embodiments are possible without departing from the spirit and scope of the invention as defined in the appended claims, and equivalents thereof.

Finally, any numerical parameters set forth in the specification and attached claims are approximations (for example, by using the term "about") that may vary depending upon the desired properties sought to be obtained by the present invention. At the very least, and not as an attempt to limit the application of the doctrine of equivalents to the scope of the claims, each numerical parameter should at least be construed in light of the number of significant digits and by applying ordinary rounding.

What is claimed is:

1. A MEMS apparatus, comprising:
a substrate defining a plane;
a micro bellows being disposed on the substrate and operable for expanding in a direction out of the substrate plane toward a rotatable ramp using a fluid flow, the substrate includes an opening therein for providing the fluid flow to the micro bellows; and
the rotatable ramp disposed above the micro bellows,
wherein, in a collapsed position of the micro bellows, the rotatable ramp is substantially parallel to the plane of the substrate, and wherein, in expanded positions of the micro bellows, the micro bellows applies a force to the rotatable ramp causes rotation of the rotatable ramp in the direction out of the substrate plane.

2. The MEMS apparatus of claim 1, further comprising a pair of ramp supports being disposed on the substrate on opposite sides of the micro bellows, the rotatable ramp is rotatably connected to the pair of ramp supports.

3. The MEMS apparatus of claim 2, wherein the ramp comprises a pair of legs and a body, the pair of legs are connected to the pair of ramp supports and defines an open area therebetween where the micro bellows is disposed.

4. The MEMS apparatus of claim 1, wherein the micro bellows comprises a plurality of bleed openings in a top surface thereof.

5. The MEMS apparatus of claim 4, wherein the ramp comprises a pair of legs and a body, the pair of legs are connected to the pair of ramp supports and defines an open area therebetween where the micro bellows is disposed.

6. A projectile, comprising:
a flow surface; and
at least one MEMS apparatus of claim 1 being disposed at the flow surface such that, in a collapsed position of the micro bellows, the MEMS apparatus is substantially flush with the flow surface and, in an expanded position of the micro bellows, the ramp of the MEMS apparatus extends out of a plane of the flow surface.

7. The projectile of claim 6, further comprising a plurality of the MEMS apparatus of claim 1 being disposed at the flow surface.

8. The projectile of claim 6, further comprising a source of fluid pressure and a fluid connection being situated between the source of fluid pressure and the opening in the substrate of the MEMS apparatus.

9. The projectile of claim 8, wherein the source of fluid pressure comprises one of external air and combustion products.

10. The projectile of claim 8, further comprising a control valve being disposed in the fluid connection.

11. The projectile of claim 8, further comprising a guidance and control system being connected to the control valve.

12. The projectile of claim 10, further comprising a relief valve being disposed in the fluid connection.

13. A projectile, comprising:
a flow surface;
at least one MEMS apparatus of claim 1 being disposed at the flow surface such that, in a collapsed position of the micro bellows, the MEMS apparatus is substantially flush with the flow surface and, in an expanded position of the micro bellows, the ramp of the MEMS apparatus extends out of a plane of the flow surface;
a source of fluid pressure and a fluid connection being situated between the source of fluid pressure and the opening in the substrate of the MEMS apparatus;
a control valve being disposed in the fluid connection; and
a guidance and control system connecting to the control valve.

14. The projectile of claim 13, wherein the source of fluid pressure comprises one of external air and combustion products.

15. The projectile of claim 14, further comprising a relief valve being disposed in the fluid connection.

16. The MEMS apparatus of claim 1, further comprising a ramp support supporting the ramp above the micro bellows.

17. The MEMS apparatus of claim 16, wherein the ramp support comprises a pair of spring supports disposed on the substrate and a pair of torsional springs, the pair torsional springs is attached at first ends to the ramp and at second ends to the spring supports, respectively.

18. The MEMS apparatus of claim 16, wherein the ramp support comprises a hinge support disposed on the substrate and a hinge attached to the hinge support and the ramp.

* * * * *